(12) United States Patent
Hackett et al.

(10) Patent No.: US 11,513,034 B2
(45) Date of Patent: Nov. 29, 2022

(54) PROBE ADAPTER FOR A BLADE OUTER AIR SEAL AND METHOD FOR USING SAME

(71) Applicant: United Technologies Corporation, Farmington, CT (US)

(72) Inventors: Bryan J. Hackett, Newington, CT (US); Eli C. Warren, Wethersfield, CT (US); Michael J. Saitta, East Hampton, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 324 days.

(21) Appl. No.: 16/791,730

(22) Filed: Feb. 14, 2020

(65) Prior Publication Data

US 2021/0255062 A1     Aug. 19, 2021

(51) Int. Cl.
    *G01M 15/14*       (2006.01)
    *F01D 21/00*       (2006.01)
    *G01R 1/067*       (2006.01)

(52) U.S. Cl.
CPC ........... *G01M 15/14* (2013.01); *F01D 21/003* (2013.01); *G01R 1/06705* (2013.01); *G01R 1/06794* (2013.01); *F05D 2240/55* (2013.01); *F05D 2260/31* (2013.01); *F05D 2260/80* (2013.01)

(58) Field of Classification Search
CPC .. G01M 15/14; F01D 21/003; G01R 1/06705; F05D 2240/55
See application file for complete search history.

(56) References Cited

U.S. PATENT DOCUMENTS

| | | | | |
|---|---|---|---|---|
| 5,155,941 A | * | 10/1992 | Takahashi | B24B 49/12 451/6 |
| 9,879,981 B1 | | 1/2018 | Dehghan Niri | |
| 2014/0069460 A1 | | 3/2014 | Kell | |
| 2014/0356132 A1 | | 12/2014 | Leroux | |
| 2014/0366613 A1 | * | 12/2014 | Warren | F01D 21/003 403/201 |
| 2015/0036130 A1 | | 2/2015 | Konomura | |
| 2017/0219814 A1 | | 8/2017 | Letter | |
| 2019/0145905 A1 | | 5/2019 | Sibbach | |
| 2019/0257705 A1 | | 8/2019 | Warren | |
| 2019/0277770 A1 | | 9/2019 | Mekala | |

FOREIGN PATENT DOCUMENTS

| | | |
|---|---|---|
| FR | 3036735 B1 | 3/2020 |
| JP | 2929473 B2 | 8/1999 |

OTHER PUBLICATIONS

EP search report for EP20211653.9 dated May 31, 2021.

* cited by examiner

*Primary Examiner* — Eric S. McCall
*Assistant Examiner* — Timothy P Graves
(74) *Attorney, Agent, or Firm* — Getz Balich LLC

(57) ABSTRACT

A probe adapter includes an adapter body including a probe aperture and a slot. The probe adapter further includes a driver slidably mounted within the slot and slidable between a first position and a second position. The driver includes a first end and a second end opposite the first end. The first end includes a ramped recess extending in a direction from the first end toward the second end. The probe adapter further includes a threaded fastener configured to contact the second end of the driver so as to retain the driver in the first position.

13 Claims, 15 Drawing Sheets

PROBE ADAPTER FOR A BLADE OUTER AIR SEAL AND METHOD FOR USING SAME

This invention was made with Government support awarded by the United States. The Government has certain rights in this invention.

BACKGROUND

1. Technical Field

This disclosure relates generally to gas turbine engines, and more particularly to probes for gas turbine engines.

2. Background Information

Gas turbine engines, such as those that power modern commercial and military aircraft, generally include a compressor section to pressurize an airflow, a combustor section for burning a hydrocarbon fuel in the presence of the pressurized air, and a turbine section to extract energy from the resultant combustion gases. The compressor section and the turbine section may each include rotatable blades and stationary vanes. Within a surrounding engine casing, the radial outermost tips of the blades are positioned in close proximity to blade outer air seals (BOAS). The BOAS may be parts of shroud assemblies mounted within the engine casing. Each BOAS may typically incorporate multiple segments that are annularly arranged within the engine casing, with the inner diameter surfaces of the segments being located closest to the blade tips.

Under certain circumstances, probes may be installed in the BOAS, for example, for use in a Non-intrusive Stress Measurement System (NSMS) or a tip-timing system for observation and management of various rotating blade parameters. However, installation of the probes may involve extensive modification and/or disassembly and reassembly of BOAS hardware. Modifications to the BOAS hardware (e.g., heat shields and BOAS support structures) may result in increased degradation of gas turbine engine components during a test program and may, therefore, result undesirable test program limitations. Further, available space proximate the BOAS may limit the locations where the probes can be installed, potentially resulting in non-ideal spacing (e.g., circumferential spacing) of probes. Accordingly, improved methods and systems the installation of probes are desirable.

SUMMARY

It should be understood that any or all of the features or embodiments described herein can be used or combined in any combination with each and every other feature or embodiment described herein unless expressly noted otherwise.

According to an embodiment of the present disclosure, a probe adapter includes an adapter body including a probe aperture and a slot. The probe adapter further includes a driver slidably mounted within the slot and slidable between a first position and a second position. The driver includes a first end and a second end opposite the first end. The first end includes a ramped recess extending in a direction from the first end toward the second end. The probe adapter further includes a threaded fastener configured to contact the second end of the driver so as to retain the driver in the first position.

In the alternative or additionally thereto, in the foregoing embodiment, the adapter body is configured to be mounted to an outer radial side of a blade outer air seal (BOAS).

In the alternative or additionally thereto, in the foregoing embodiment, the adapter body includes an inner adapter side and an outer adapter side extending between a first adapter end and a second adapter end and the probe aperture extends from the inner adapter side to the outer adapter side.

In the alternative or additionally thereto, in the foregoing embodiment, the probe adapter further includes an adapter portion mounted to the second adapter side of the adapter body. The adapter portion includes a threaded aperture configured to threadably retain the threaded fastener.

In the alternative or additionally thereto, in the foregoing embodiment, the slot is oriented in a slot direction extending between the first adapter end and the second adapter end.

In the alternative or additionally thereto, in the foregoing embodiment, at least a portion of the slot is disposed within the probe aperture.

In the alternative or additionally thereto, in the foregoing embodiment, in the first position, the driver is configured to retain a probe assembly of a probe within the probe aperture and, in the second position, the driver is configured to permit removal of the probe assembly from the probe aperture.

According to another embodiment of the present disclosure, a gas turbine engine includes a blade outer air seal (BOAS) including an inner radial side and an outer radial side. The gas turbine engine further includes a probe adapter mounted to the outer radial side of the BOAS. The probe adapter includes an adapter body including a probe aperture and a slot. The probe adapter further includes a driver slidably mounted within the slot and slidable between a first position and a second position. The driver includes a first end and a second end opposite the first end. The first end includes a ramped recess extending in a direction from the first end toward the second end. The probe adapter further includes a threaded fastener configured to contact the second end of the driver so as to retain the driver in the first position.

In the alternative or additionally thereto, in the foregoing embodiment, the gas turbine engine further includes a probe including a probe assembly and a probe cable extending from the probe assembly. The probe assembly is retained within the probe aperture of the adapter body by the driver in the first position.

In the alternative or additionally thereto, in the foregoing embodiment, the gas turbine engine further includes a plug retained within the probe aperture of the adapter body by the driver in the first position.

In the alternative or additionally thereto, in the foregoing embodiment, the gas turbine engine further includes a heat shield in contact with the BOAS and disposed radially outside the probe adapter.

In the alternative or additionally thereto, in the foregoing embodiment, the probe cable is disposed radially between the probe adapter and the heat shield along at least a portion of a length of the probe cable.

In the alternative or additionally thereto, in the foregoing embodiment, the probe assembly includes a center axis and the center axis intersects the heat shield.

In the alternative or additionally thereto, in the foregoing embodiment, the BOAS and the probe adapter form an integral component.

In the alternative or additionally thereto, in the foregoing embodiment, the probe adapter further includes an adapter portion mounted to the adapter body. The adapter portion includes a threaded aperture configured to threadably retain the threaded fastener.

In the alternative or additionally thereto, in the foregoing embodiment, the adapter body includes an inner adapter side and an outer adapter side extending between a first adapter end and a second adapter end and the probe aperture extends from the inner adapter side to the outer adapter side.

In the alternative or additionally thereto, in the foregoing embodiment, the slot is oriented in a slot direction extending between the first adapter end and the second adapter end.

According to another embodiment of the present disclosure, a method for installing a probe in a probe adapter for a blade outer air seal (BOAS) includes providing the probe adapter mounted to an outer radial side of the BOAS. The probe adapter includes an adapter body including a probe aperture and a slot. The method further includes positioning a driver slidably mounted within the slot in a second position. The driver includes a first end and a second end opposite the first end. The first end includes a ramped recess extending in a direction from the first end toward the second end. The method further includes installing the probe in the probe adapter by positioning the probe assembly of the probe within the probe aperture. The method further includes inserting a threaded fastener into the probe adapter and contacting the second end of the driver with the threaded fastener so as to slide the driver from the second position to a first position to retain the probe assembly within the probe aperture.

In the alternative or additionally thereto, in the foregoing embodiment, the method further includes contacting a probe cable of the probe with the first end of the driver.

In the alternative or additionally thereto, in the foregoing embodiment, the method further includes bending the probe cable subsequent to sliding the driver from the second position to the first position.

The present disclosure, and all its aspects, embodiments and advantages associated therewith will become more readily apparent in view of the detailed description provided below, including the accompanying drawings.

DETAILED DESCRIPTION

Figure 1:
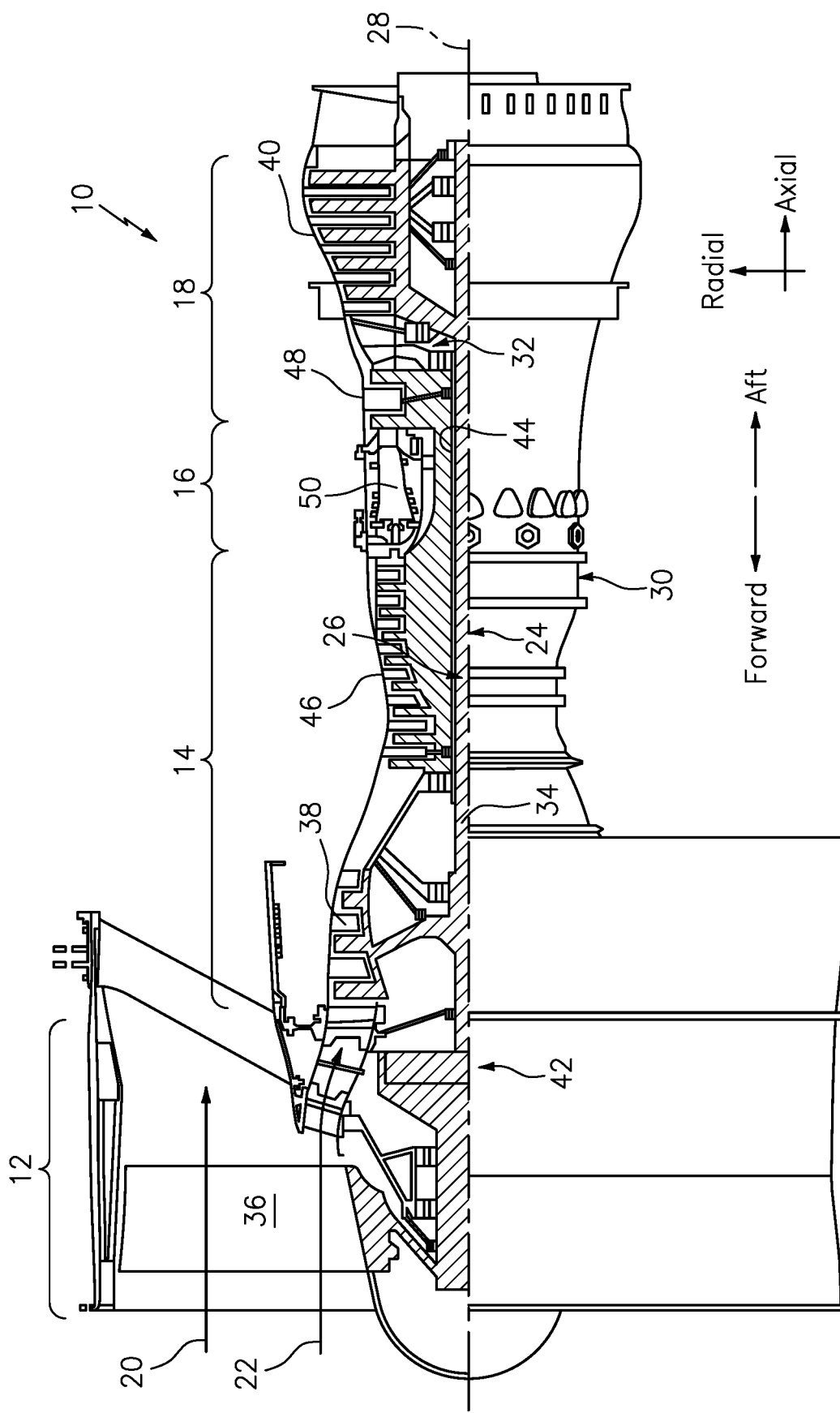
FIG. 1 illustrates a side cross-sectional view of a gas turbine engine, in accordance with one or more embodiments of the present disclosure.

It is noted that various connections are set forth between elements in the following description and in the drawings. It is noted that these connections are general and, unless specified otherwise, may be direct or indirect and that this specification is not intended to be limiting in this respect. A coupling between two or more entities may refer to a direct connection or an indirect connection. An indirect connection may incorporate one or more intervening entities. It is further noted that various method or process steps for embodiments of the present disclosure are described in the following description and drawings. The description may present the method and/or process steps as a particular sequence. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the description should not be construed as a limitation.

Referring to FIG. 1, an exemplary gas turbine engine 10 is schematically illustrated. The gas turbine engine 10 is disclosed herein as a two-spool turbofan engine that generally includes a fan section 12, a compressor section 14, a combustor section 16, and a turbine section 18. The fan section 12 drives air along a bypass flow path 20 while the compressor section 14 drives air along a core flow path 22 for compression and communication into the combustor section 16 and then expansion through the turbine section 18. Although depicted as a turbofan gas turbine engine in the disclosed non-limiting embodiments, it should be understood that the concepts described herein are not limited to use with turbofans as the teachings may be applied to other types of turbine engines including those with three-spool architectures.

The gas turbine engine 10 generally includes a low-pressure spool 24 and a high-pressure spool 26 mounted for rotation about a longitudinal centerline 28 of the gas turbine engine 10 relative to an engine static structure 30 via one or more bearing systems 32. It should be understood that various bearing systems 32 at various locations may alternatively or additionally be provided.

The low-pressure spool 24 generally includes a first shaft 34 that interconnects a fan 36, a low-pressure compressor 38, and a low-pressure turbine 40. The first shaft 34 may be connected to the fan 36 through a gear assembly of a fan drive gear system 42 to drive the fan 36 at a lower speed than the low-pressure spool 24. The high-pressure spool 26 generally includes a second shaft 44 that interconnects a high-pressure compressor 46 and a high-pressure turbine 48. It is to be understood that "low pressure" and "high pressure" or variations thereof as used herein are relative terms indicating that the high pressure is greater than the low pressure. An annular combustor 50 is disposed between the high-pressure compressor 46 and the high-pressure turbine 48 along the longitudinal centerline 28. The first shaft 34 and the second shaft 44 are concentric and rotate via the one or more bearing systems 32 about the longitudinal centerline 28 which is collinear with respective longitudinal centerlines of the first and second shafts 34, 44.

Airflow along the core flow path 22 is compressed by the low-pressure compressor 38, then the high-pressure compressor 46, mixed and burned with fuel in the combustor 50, and then expanded over the high-pressure turbine 48 and the low-pressure turbine 40. The low-pressure turbine 40 and the high-pressure turbine 48 rotationally drive the low-pressure spool 24 and the high-pressure spool 26, respectively, in response to the expansion.

Figure 2:
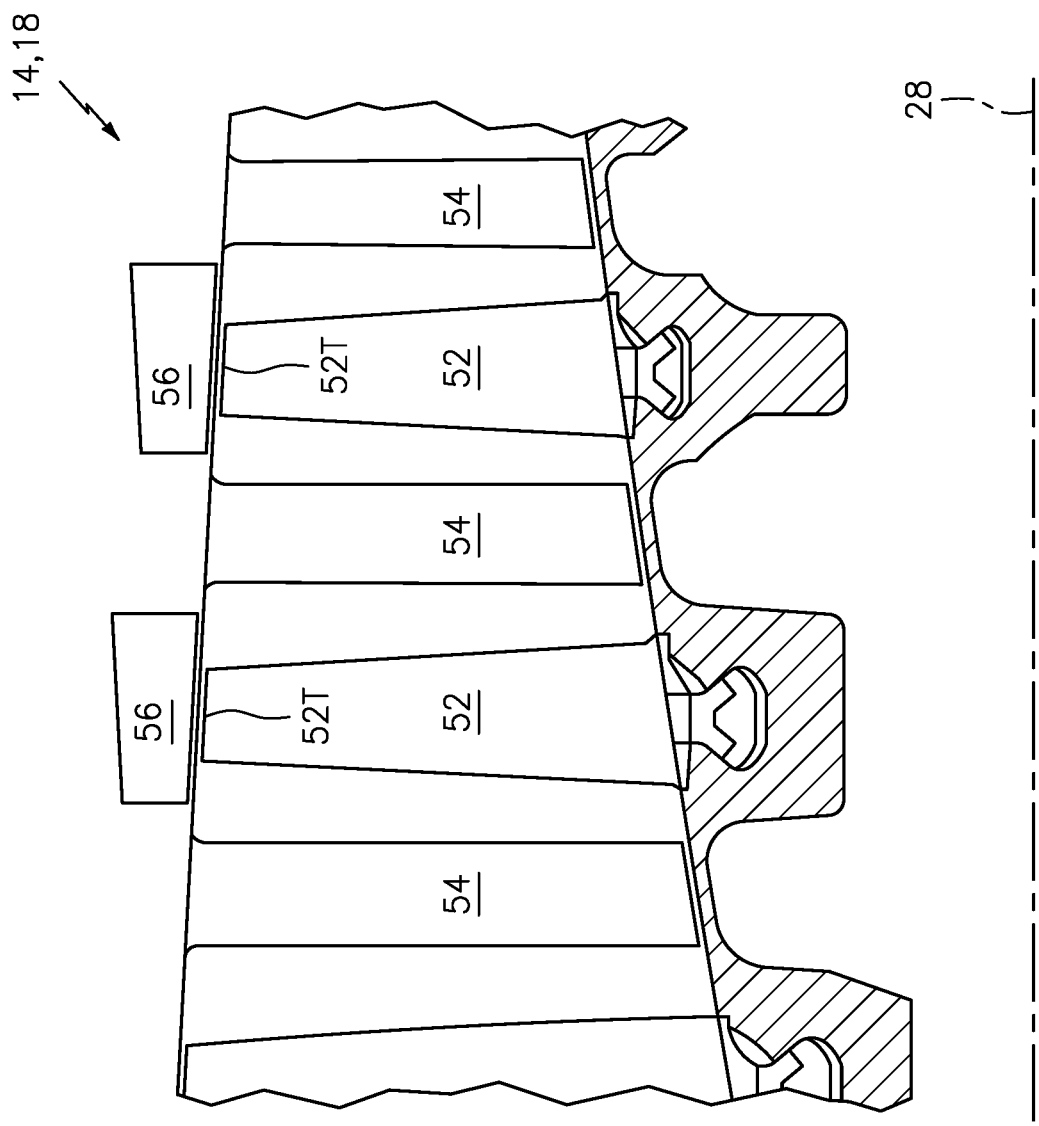
FIG. 2 illustrates a cross-sectional view of turbine section of a gas turbine engine, in accordance with one or more embodiments of the present disclosure.
Figure 3:
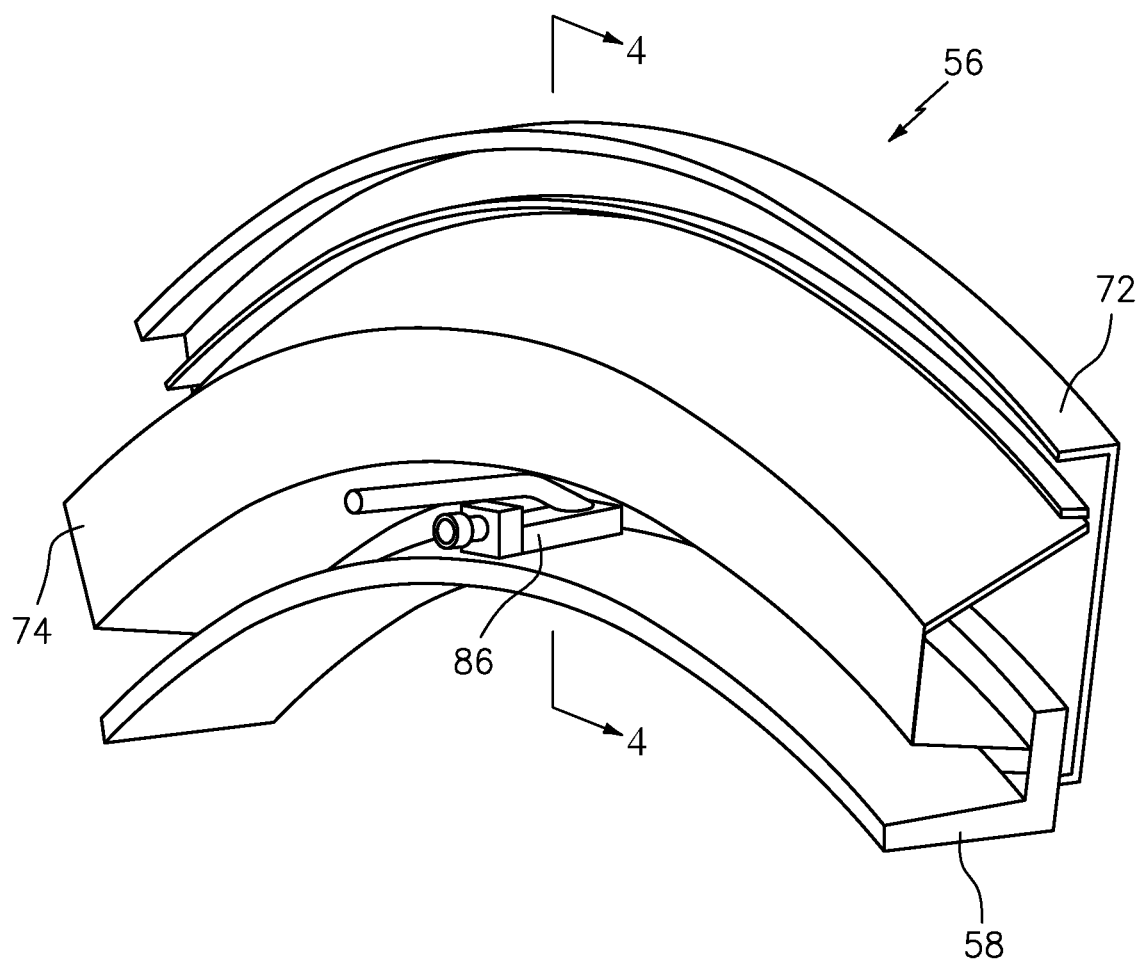
FIG. 3 illustrates a perspective view of a portion of an exemplary blade outer air seal assembly, in accordance with one or more embodiments of the present disclosure.
Figure 4:
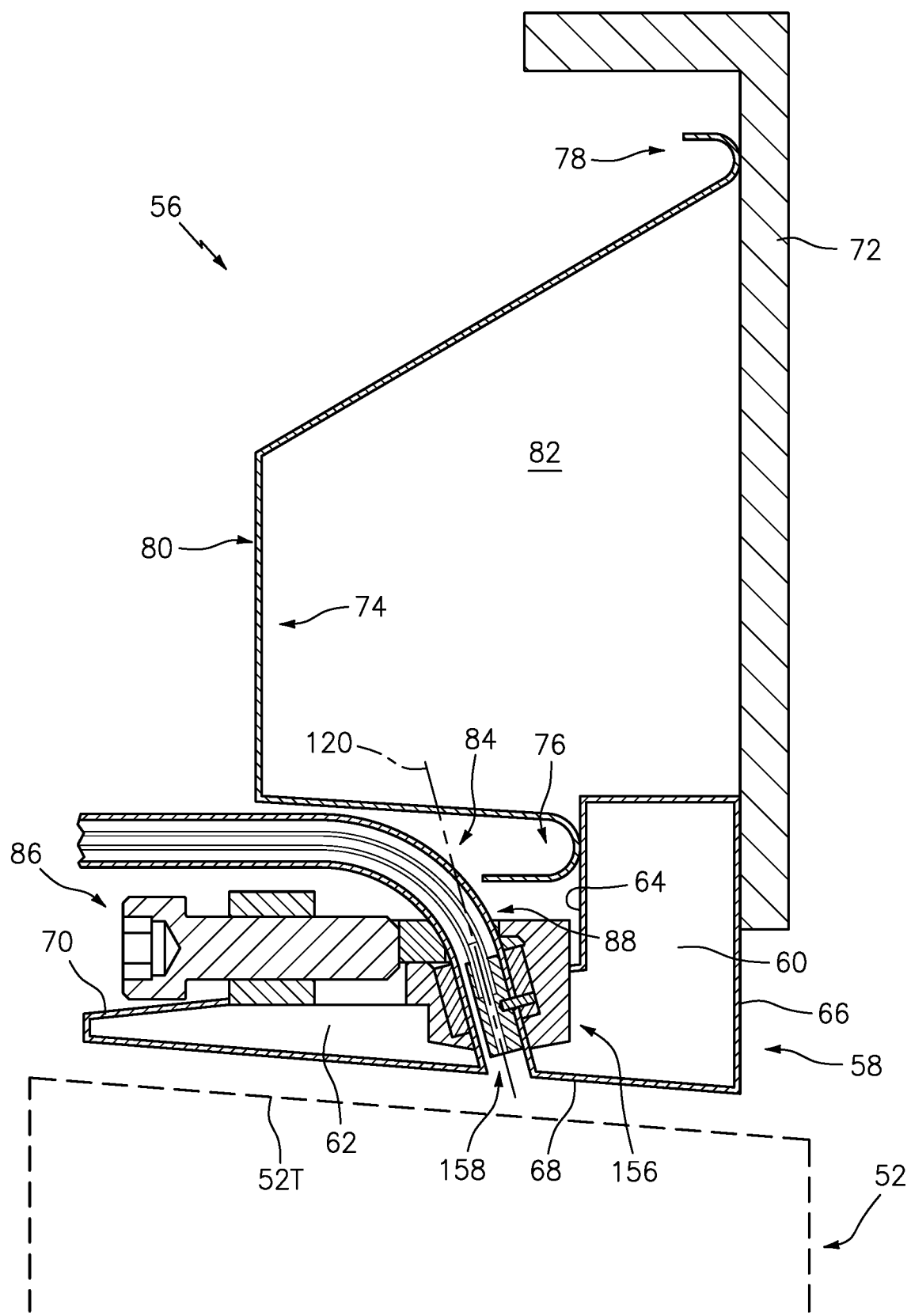
FIG. 4 illustrates a side cross-sectional view of a blade outer air seal assembly of FIG. 3 taken along Line 4-4, in accordance with one or more embodiments of the present disclosure.

Referring to FIG. 2-4, one or more sections of the gas turbine engine 10, such as the compressor section 14 and the turbine section 18, may include a plurality of airfoils, including, for example, one or more blades 52 and vanes 54. The sections 14, 18 may further include at least one blade outer air seal assembly (hereinafter "BOAS assembly") 56 located radially outward of the blades 52 with respect to the longitudinal centerline 28 of the gas turbine engine 10. The BOAS assembly 56 includes at least one blade outer air seal (hereinafter "BOAS") 58. The BOAS 58 may include a radial portion 60 and an axial portion 62. The radial portion 60 may include a first axial side 64 and a second axial side 66 opposite the first axial side 64. The axial portion 62 may include an inner radial side 68, radially adjacent the blade tips 52T of the blades, and an outer radial side 70 opposite the inner radial side 68.

The BOAS assembly 56 may further include a support 72 in contact with or mounted to the radial portion 60 of the BOAS 58, for example, along the second axial side 66. The support 72 may be configured to mount the BOAS 58, for example, to a case (e.g., a turbine case, diffuser case, etc.) of the turbine section 18 or to an actuator configured to move the BOAS 58 between various radial positions so as to control a distance between the inner radial side 68 of the BOAS and the blade tips 52T.

The BOAS assembly 56 may further include a heat shield 74 in contact with or mounted to one or both of the BOAS 58 and the support 72. The heat shield 74 may be generally disposed radially outside BOAS 58 and axially adjacent the support 72. For example, as shown in FIGS. 2 and 3, the heat shield may include a first end 76 in contact with the first axial side 64 of the radial portion 60 of the BOAS 58 and a second end 78 in contact with the support 72. In various embodiments, the heat shield 74 may be mounted to one or both of the BOAS 58 and the support 72 at one or both of the first end 76 and the second end 78 by any suitable attachment means such as, for example, fasteners, welds, etc. The heat shield 74 may include a middle portion 80 axially spaced from both the first end 76 and the second end 78 such that the heat shield 74 forms a shielded region 82 bounded by the heat shield 74, the support 72, and the BOAS 58. The heat shield 74 and the outer radial side 70 may define a radial gap 84 therebetween. In various embodiments, one or more of the BOAS 58, the support 72, and the heat shield 74 may be annularly oriented with respect to the longitudinal centerline 28.

Referring to FIGS. 3-10, the BOAS assembly 56 includes at least one probe adapter 86 mounted to the BOAS 58. The probe adapter 86 may be mounted to the outer radial side 70 of the BOAS 58 and disposed in the radial gap 84. As will be discussed in further detail, the probe adapter 86 is configured to position a probe 88 (e.g., an optical probe) relative to the BOAS 58. The probe adapter 86 may include an adapter body 90 including an inner side 92 and an outer side 94 extending between a first adapter end 96 and a second adapter end 98 opposite the first adapter end 96. In various embodiments, the BOAS assembly 56 may include more than one probe adapter 70. For example, the BOAS assembly 56 may include a plurality of the probe adapters 70 circumferentially spaced about the BOAS 58. The plurality of the probe adapters 70 may have a uniform or a non-uniform spacing about the BOAS 56 as required by the particular application. In various embodiments, at least a portion of the probe adapter 86 may be disposed in a recess 156 of the BOAS 58. The BOAS 58 may include a probe port 158 formed through the BOAS 58 and aligned with the probe 88 to enable the probe 88 to observe the blade tips 52T. For example, the probe portion 158 may extend between the recess 156 and inner radial side 68. In various embodiments, the probe adapter 86 may be integrally formed with the BOAS 58.

The adapter body 90 may further include a probe aperture 100 extending from the inner side 92 to the outer side 94 of the adapter body 90. The adapter body 90 may further include a slot 102 generally oriented in a direction extending between the first adapter end 96 and the second adapter end 98. The slot 102 may include a first end 104 and a second end 106 opposite the first end 104. At least a portion of the slot 102 between the first end 104 and the second end 106 may be disposed within the probe aperture 100.

In order to observe the blades 52, for example, to facilitate operations of a Non-intrusive Stress Measurement System (NSMS) or a tip-timing system, the BOAS assembly 56 may include one or more of the probe 72 positioned within one or more of the probe adapter 70, as discussed above. For example, by comparing a theoretical time of arrival of the blade tips 52T to an actual time of arrival provided by the probe 72, a deflection of the blades 52 may be determined. The deflection of the blades 52 may be used to calculate a stress/strain measurement of the blades 52. It should be appreciated, however, that other measurements may be performed with the probe 72 such as, for example, temperature measurements.

The probe 88 may include a probe assembly 108 and a probe cable 110 extending from the probe assembly 108. The probe assembly 108 may be configured to be retained within the probe aperture 100 of the adapter body 90. In various embodiments, the probe assembly 108 may include an optical head 112 surrounding and retaining a fiber 114 of the probe cable 110. The probe assembly 108 may additionally include a collar 116 coupling the probe assembly 108 and the probe cable 110 together, for example, with a set screw 118. The probe assembly 108 may define a center axis 120 corresponding to the orientation of the fiber 114 within the probe assembly 108. As shown, for example, in FIG. 6, the probe cable 110 may include one or both of an inner hypo tube 122 and an outer hypo tube 124 configured to house and support the fiber 114.

Figure 5:
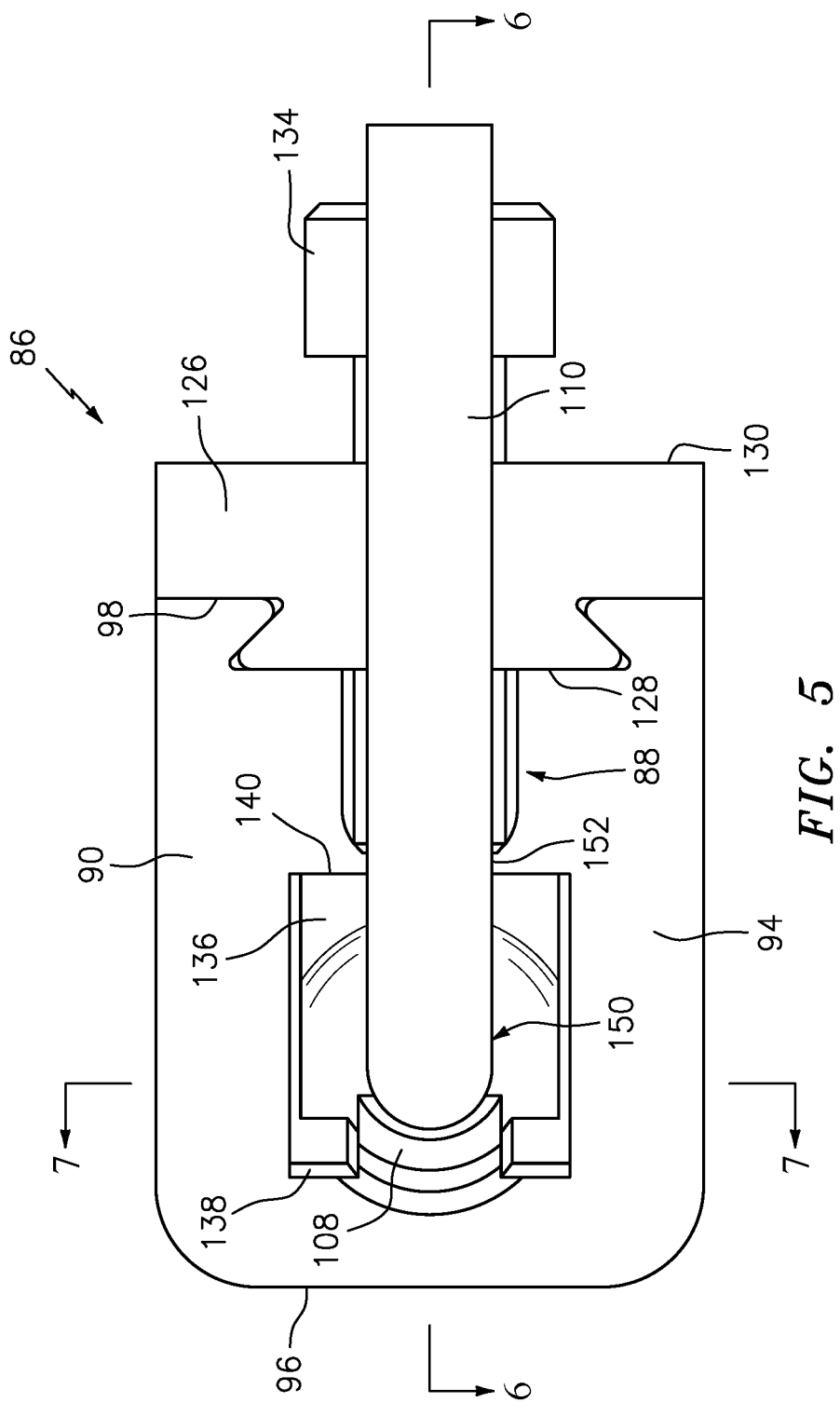
FIG. 5 illustrates a top view of an exemplary probe adapter, in accordance with one or more embodiments of the present disclosure.
Figure 6:
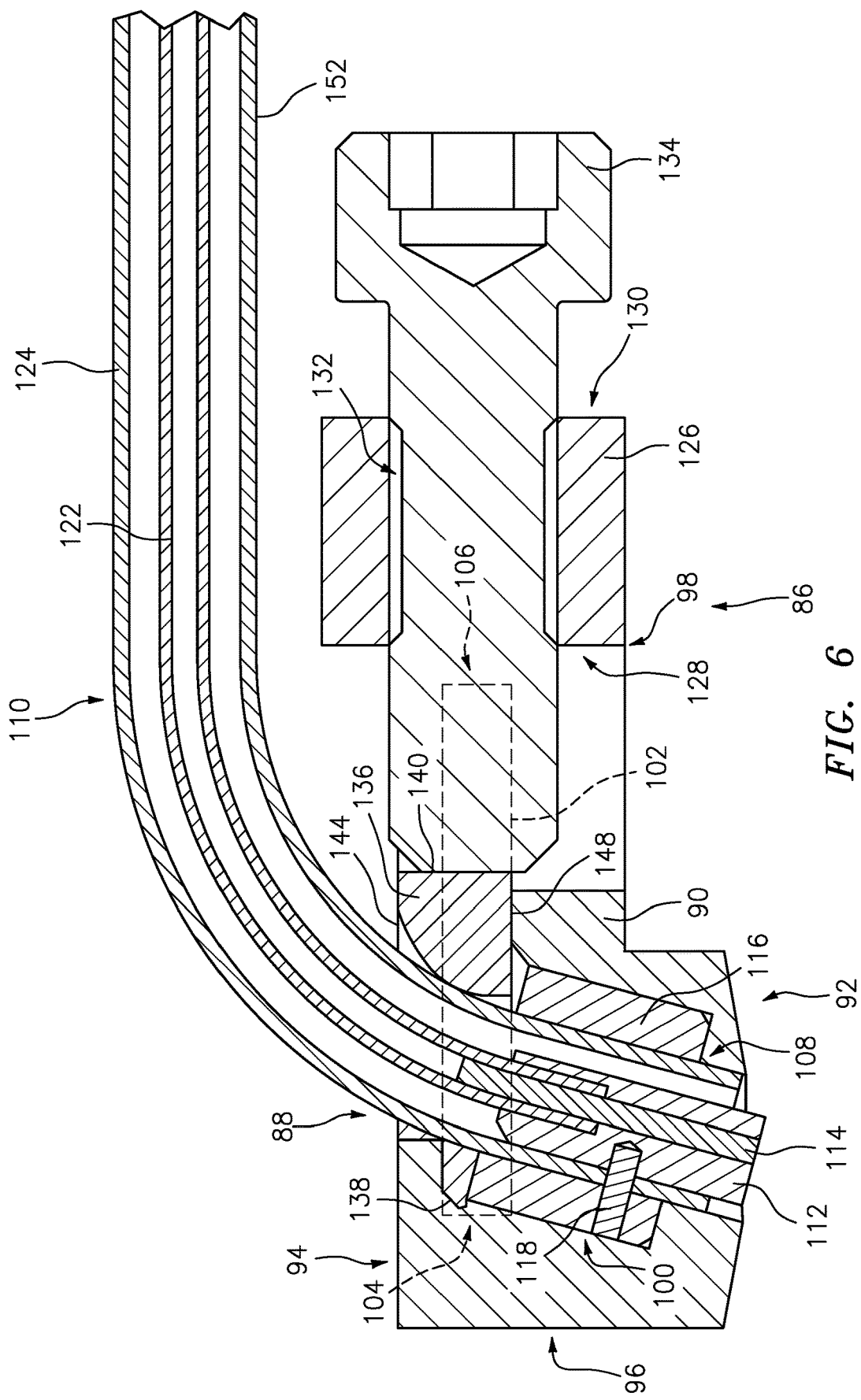
FIG. 6 illustrates a side cross-sectional view of the probe adapter of FIG. 5 taken along Line 6-6, in accordance with one or more embodiments of the present disclosure.
Figure 7:
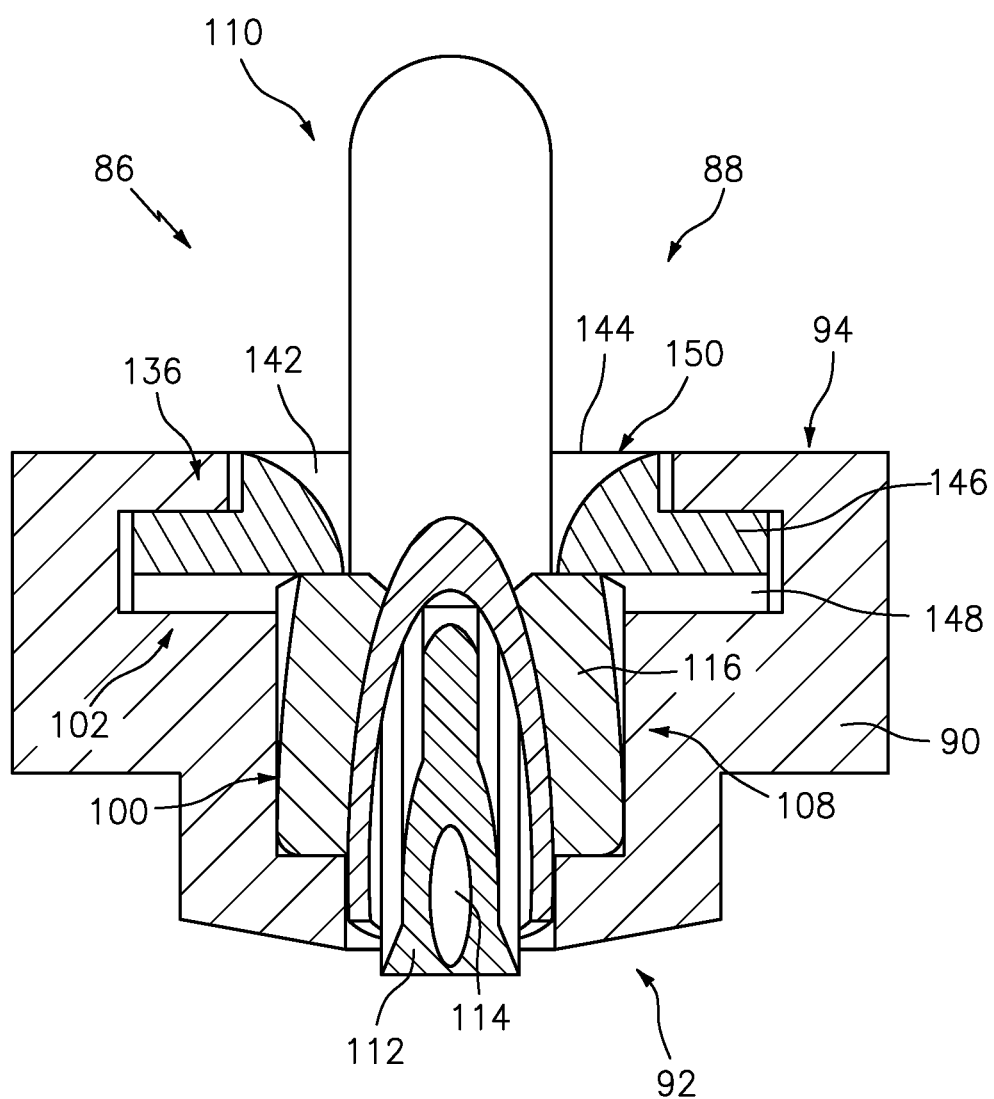
FIG. 7 illustrates a front cross-sectional view of the probe adapter of FIG. 5 taken along Line 7-7, in accordance with one or more embodiments of the present disclosure.
Figure 8:
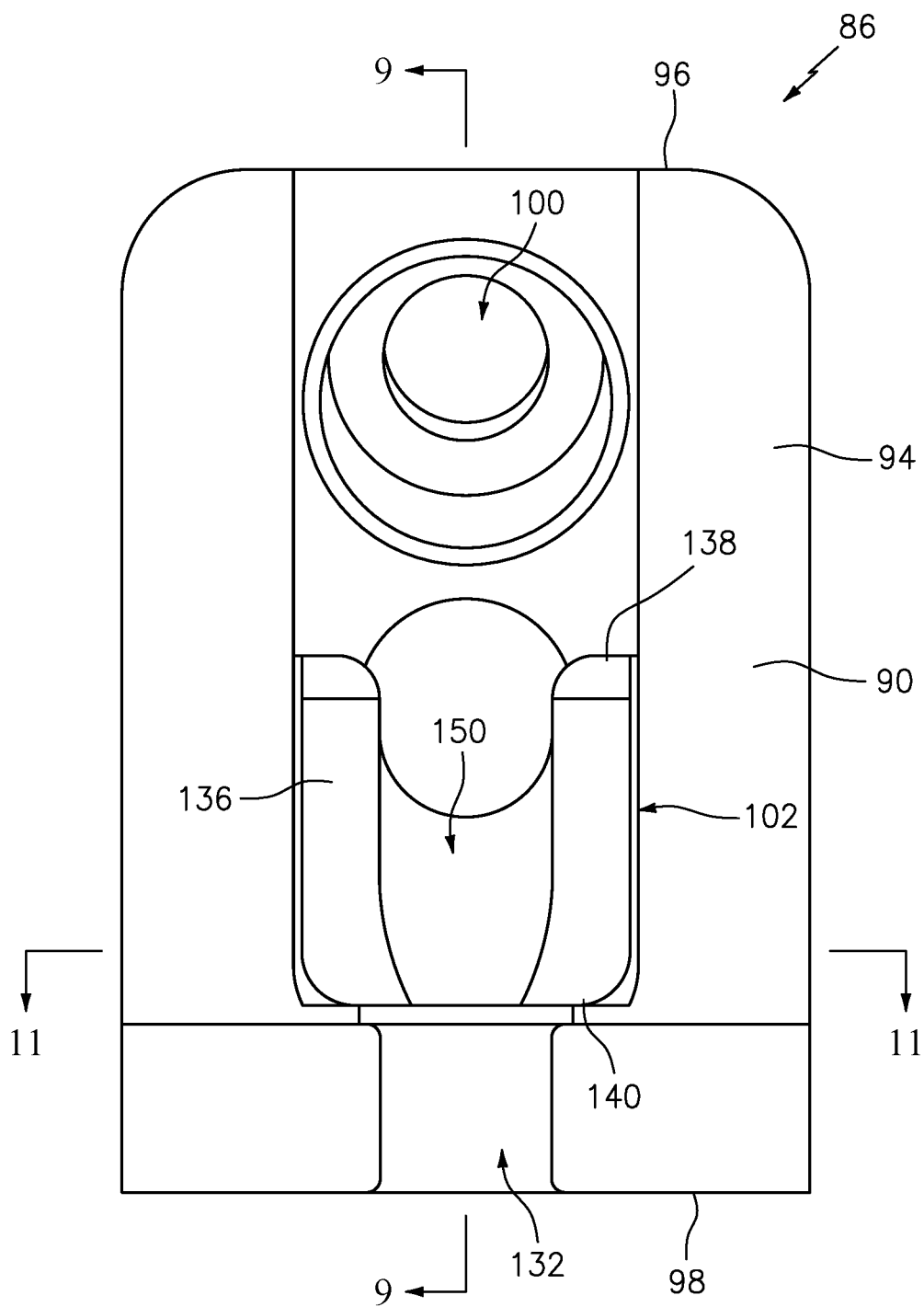
FIG. 8 illustrates a top view of an exemplary probe adapter, in accordance with one or more embodiments of the present disclosure.

In various embodiments, the probe adapter 86 may include an adapter portion 126, for example, an adapter portion 126 having a dovetail configuration as shown in FIG. 5. The adapter portion 126 may include a first side 128 and a second side 130 opposite the first side 128. The first side 128 of the adapter portion 126 may define the second end 106 of the slot 102. The adapter portion 126 may be welded or otherwise attached to the adapter body 90 by any suitable method. The adapter portion 126 may include a threaded aperture 132 extending through the adapter portion 126 from the first side 128 to the second side 130. As will be discussed in greater detail, the threaded aperture 132 of the adapter portion 126 may accommodate the insertion and removal of a corresponding threaded fastener 134 (e.g., a threaded bolt or screw) and may be configured to threadably retain the fastener 134.

The probe adapter 86 may include a driver 136 slidably mounted within the slot 102 and slidable between a first position and a second position. The driver 136 includes a first end 138 and a second end 140 opposite the first end. The driver 136 further includes a top portion 142 defining a top side 144 and a bottom portion 146 defining a bottom side 148. The bottom portion 146 may have a width W1 that is greater than a width W2 of the top portion 142 such that the bottom portion 146 is configured to be retained in the slot 102. The first end 138 of the driver 136 may include a ramped recess 150 extending in a direction from the first end 138 to the second end 140 of the driver 136. The ramped recess 150 may be shaped to substantially correspond to an exterior surface 152 of the probe cable 110. The ramped recess 150 may additionally be shaped (e.g., curved) to substantially correspond to a bend orientation of the probe cable 110. For example, in a direction from the bottom side 148 to the top side 144 of the driver 136, the ramped recess 150 may increasingly extend a greater distance from the first end 138 to the second end 140.

As noted above, the driver 136 may be slidable between a first position (see, e.g., FIGS. 4-6) and a second position (see, e.g., FIGS. 8 and 9) within the slot 102. In the first position, the first end 138 of the driver 136 may be disposed proximate or may contact the first end 104 of the slot 102 and/or may be in contact with the probe 88 (e.g., the probe cable 110). In the first position, the driver 136 may additionally cover at least a portion of the probe assembly 108 such that the bottom side 148 of the driver 136 fixes and retains the probe assembly 108 within the probe aperture 100. In the second position, the second end 140 of the driver 136 may be disposed proximate or may contact the second end 106 of the slot 102. In the second position, the driver 136 may be substantially withdrawn from the probe aperture 100 so as to permit removal of the probe assembly 108 from the probe aperture 100.

The threaded fastener 134 may be inserted into the threaded aperture 132 of the adapter portion 126 so as to contact the second end 140 of the driver 136. Accordingly, the threaded fastener 134, in contact with the second end 140 of the driver 136, may fix the driver 136 in the first position so as to retain the probe assembly 108 within the probe aperture 100. The threaded fastener 132 may additionally be used to slide the driver 136 from the second position to the first position by threadably inserting the threaded fastener 132 into the threaded aperture 132 to achieve the desired position of the driver 136.

Referring to FIGS. 8-11, in various embodiments, the probe adapter 86 may not include the adapter portion 126. For example, the adapter body 90 may include one or more structural features of the adapter portion 126. For example, the adapter body 90 may include the threaded aperture 132. Additionally, the adapter body 90 may define the second end 106 of the slot 102. In various embodiments, adapter body 90 may be formed by an additive manufacturing process (e.g., direct metal laser sintering (DMLS)), for example, to reduce manufacturing time and cost. In various embodiments, the driver 136 may be additively manufactured within the slot 102 during additive manufacturing of the adapter body 90. Accordingly, the additively manufactured adapter body 90 may reduce the risk of foreign object damage (FOD) by capturing the driver 136. In various embodiments, during additive manufacturing of the adapter body 90 and the driver 136, additively manufactured supports (not shown) may be formed between the adapter body 90 and the driver 136. These additively manufactured supports may be broken subsequent to the additive manufacture of the probe adapter 86, for example, during an initial operation of the driver 136 with the threaded fastener 134.

As previously discussed, the probe adapter 86 may be disposed in the radial gap 84 with the heat shield 74 disposed radially outside the probe adapter 86. In various embodiments, the center axis 120 of the probe assembly 108 may intersect the heat shield 74. The probe cable 110 may additionally be disposed within the radial gap 84 along at least a portion of a length of the probe cable 110. The low-profile configuration of the probe adapter 86 may permit introduction and removal of the probe 88 from the probe adapter 86 without modification or removal of the heat shield 74 or the surrounding structure of the BOAS assembly 56. For example, the substantially axial orientation of the threaded fastener 134 load path may reduce a radial height of the probe adapter 86 while simplifying installation and removal of the probe 88 within the minimal space of the radial gap 84. The probe adapter 86 can remain within the BOAS assembly 56 thereby permitting relatively rapid installation and removal of test equipment (e.g., probe 88) in the event of a test program.

Referring to FIGS. 3, 4, and 12-15, a method 1200 for installing a probe 88 in the probe adapter 86 is provided. In Step 1202, the threaded fastener 134 is at least partially withdrawn from the probe adapter 86 so as to allow the driver 136 to slide freely within the slot 102. In Step 1204, the driver 136 is positioned in the second position (see, e.g., FIG. 13) so as to provide access to the probe aperture 100.

Figure 9:
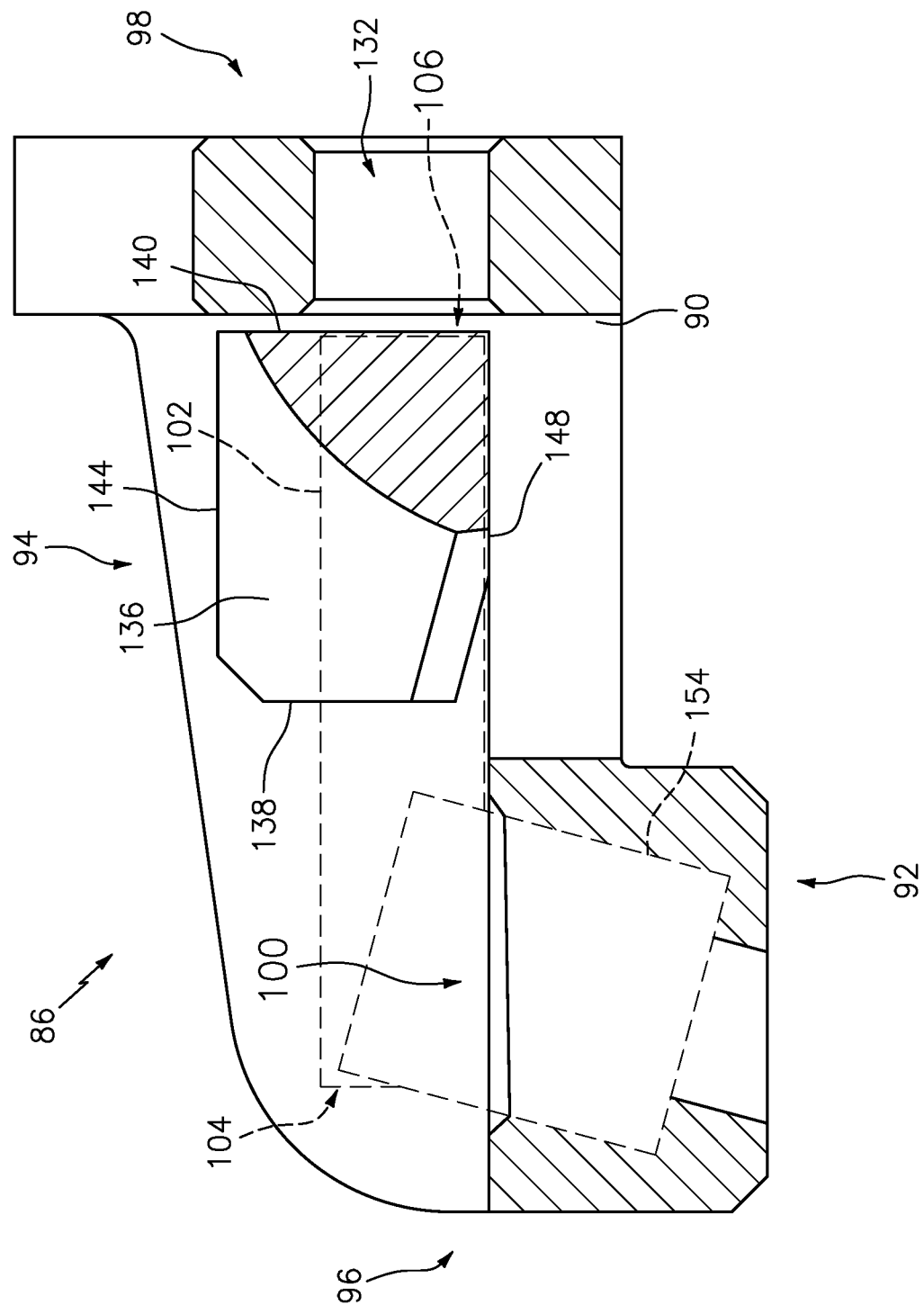
FIG. 9 illustrates a side cross-sectional view of the probe adapter of FIG. 8 taken along Line 9-9, in accordance with one or more embodiments of the present disclosure.
Figure 10:
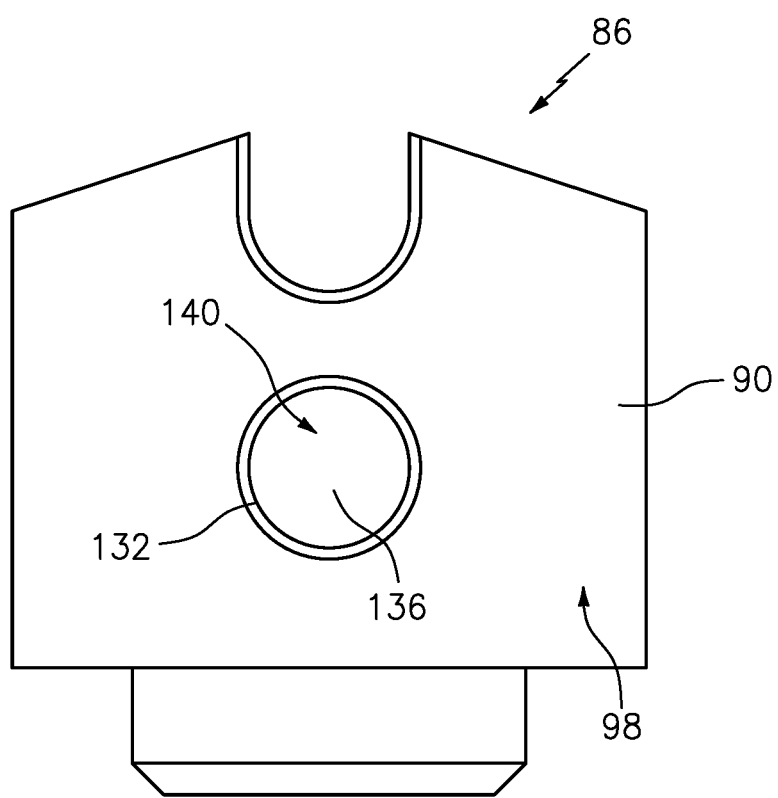
FIG. 10 illustrates a rear view of the probe adapter of FIG. 8, in accordance with one or more embodiments of the present disclosure.
Figure 11:
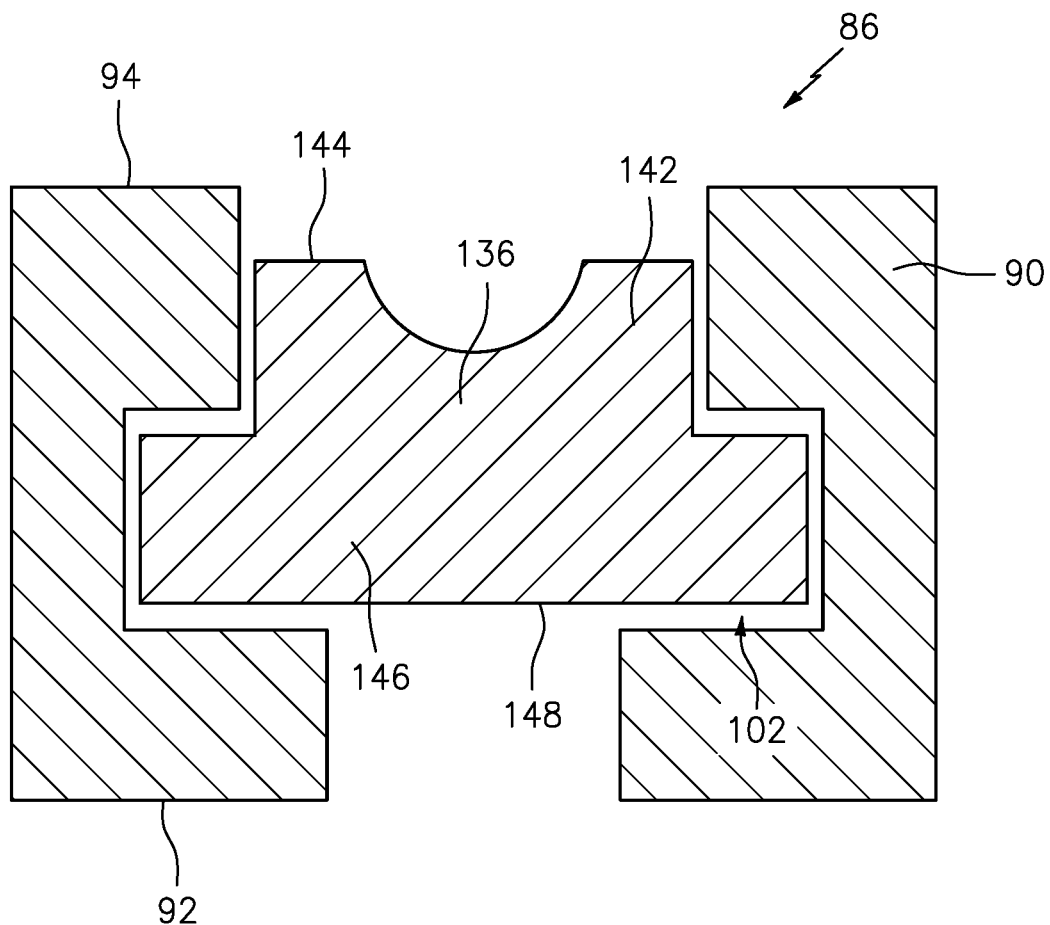
FIG. 11 illustrates a rear cross-sectional view of the probe adapter of FIG. 8 taken along Line 11-11, in accordance with one or more embodiments of the present disclosure.
Figure 12:
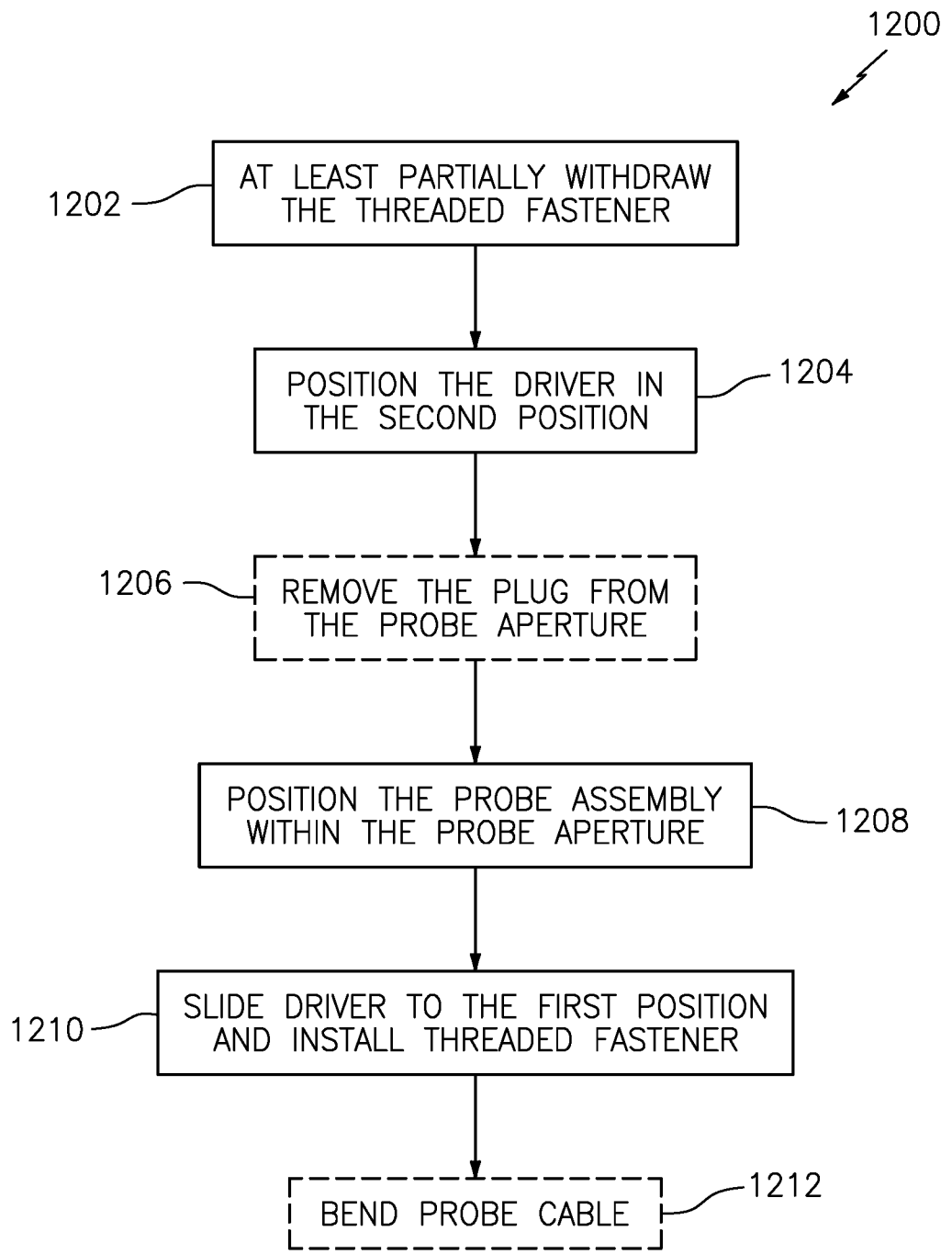
FIG. 12 illustrates a flowchart depicting a method for installing a probe in a probe adapter for a blade outer air seal, in accordance with one or more embodiments of the present disclosure.
Figure 13:
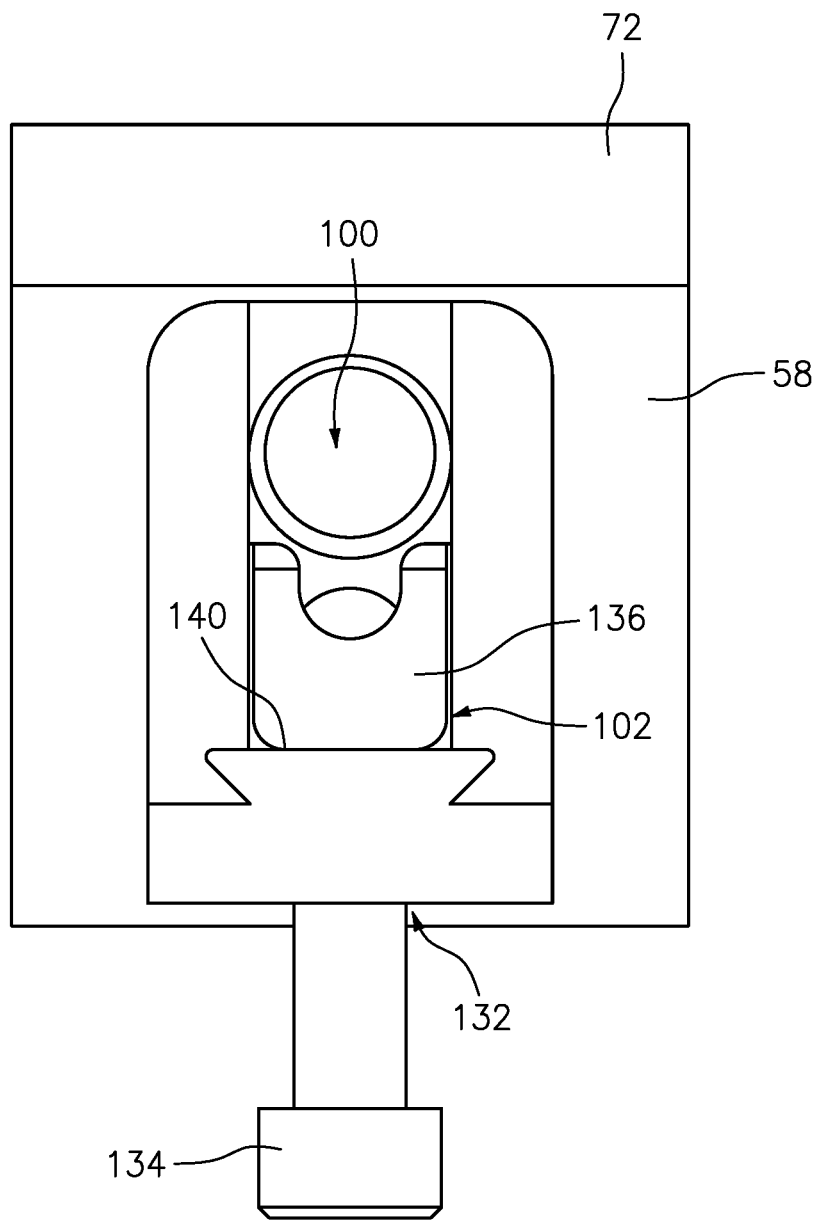
FIG. 13 illustrates a top view of a probe adapter at a stage of the method of FIG. 12, in accordance with one or more embodiments of the present disclosure.

In various embodiments, for example, when the probe 88 is not installed in the probe adapter 86, a plug 154 may be installed in the probe aperture 100 (see, e.g., FIG. 9). The plug 154 may substantially correspond in shape and/or size to one or both of the probe assembly 108 and the probe aperture 100. Accordingly, in Step 1206, the plug 154 may be removed from the probe aperture 100, if necessary (e.g., if the plug 154 is installed in the probe adapter 86).

Figure 14:
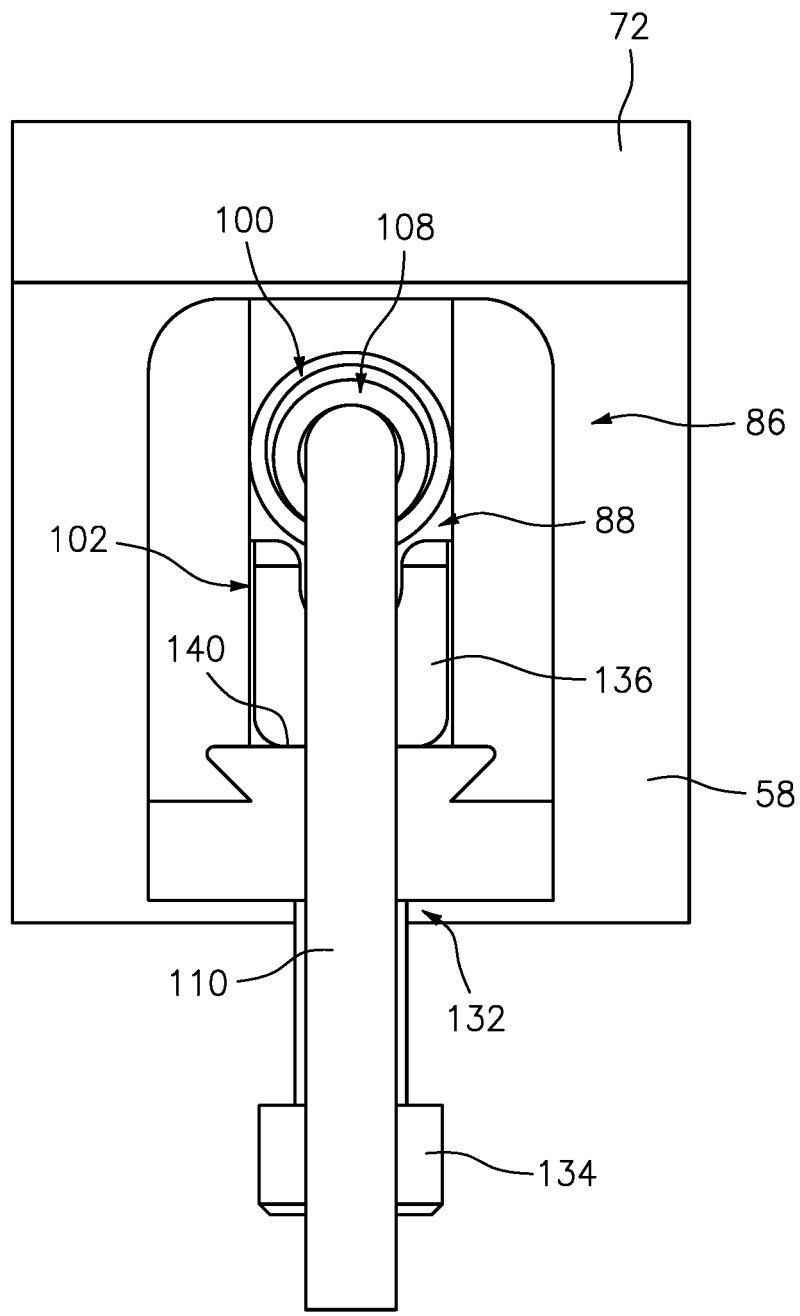
FIG. 14 illustrates a top view of a probe adapter at a stage of the method of FIG. 12, in accordance with one or more embodiments of the present disclosure.
Figure 15:
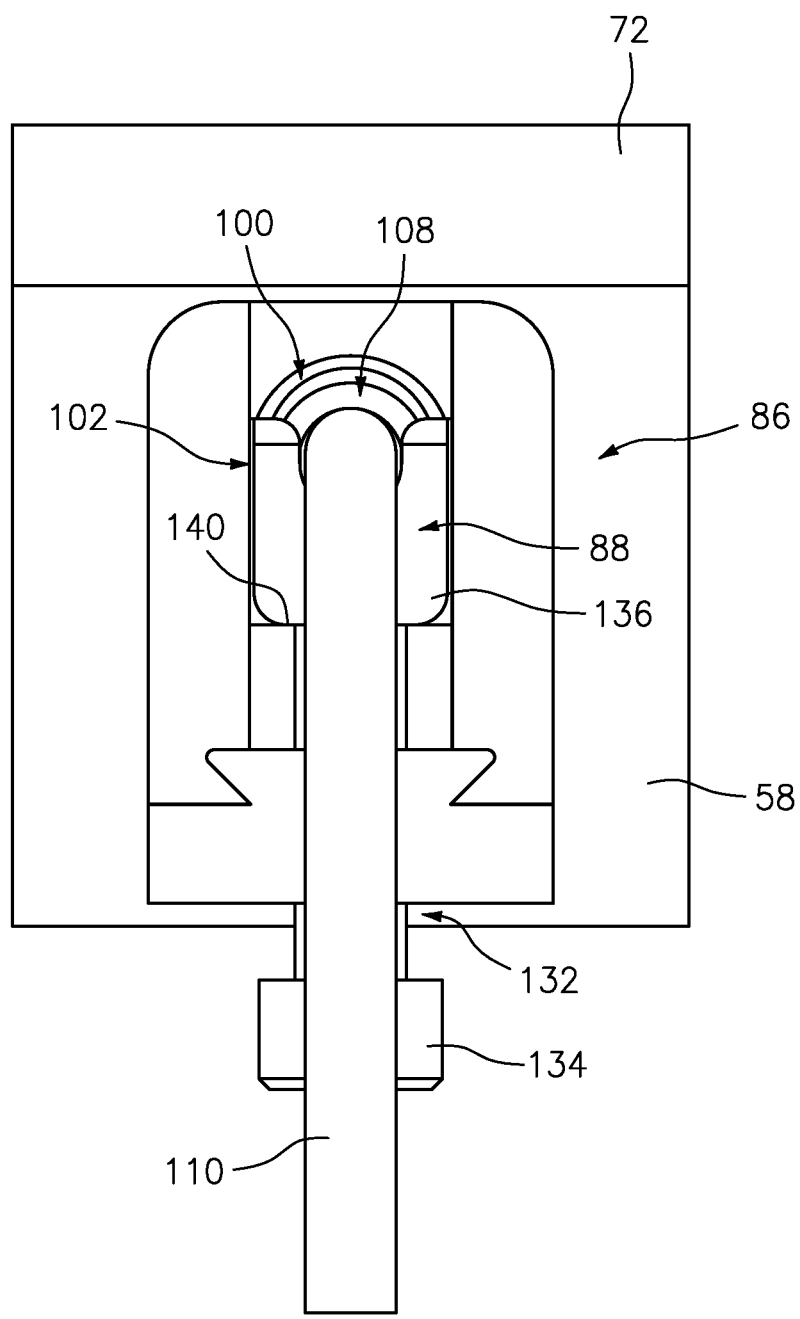
FIG. 15 illustrates a top view of a probe adapter at a stage of the method of FIG. 12, in accordance with one or more embodiments of the present disclosure.

In Step 1208, the probe 88 is installed in the probe adapter 86 by positioning the probe assembly 108 within the probe aperture 100 (see, e.g., FIG. 14). In Step 1210, the driver 136 is slid from the second position to the first position so as to retain the probe assembly 108 within the probe aperture 100. The driver 136 may contact one or both of the probe assembly 108 and the probe cable 110 in the first position. The threaded fastener 134 may then be inserted into the probe adapter 86, via the threaded aperture 132, so as to contact the second end 140 of the driver 136 fixing the driver 136 in place (see, e.g., FIG. 15). Optionally, the threaded fastener 134 may be tightened to provide a desired torque to the threaded fastener 134. Step 1210 may alternatively be performed by inserted the threaded fastener 134 into the probe adapter 86 and contacting the second end 140 of the driver 136 with the threaded fastener 134 so as to slide the driver 136 from the second position to the first position to retain the probe assembly 108 within the probe aperture 100. As one of ordinary skill in the art will understand, the Steps 1202-1210, discussed above, for installing the probe 88 in the probe adapter 86, may be used in reverse order to uninstall the probe 88 from the probe adapter 86.

In Step 1212, the probe cable 110 may be bent subsequent to sliding the driver 136 from the second position to the first position to secure the probe adapter 108 within the probe aperture 100, in order to provide clearance for installation of the heat shield 74 (see, e.g., FIG. 4). Bending of the probe cable 110 subsequent to installation of the probe 88 within the probe adapter 86 may be performed, for example, during initial assembly of the BOAS assembly 56 or where portions of the BOAS assembly 56 (e.g., the heat shield 74) have been removed. To accomplish installation of the probe 88 within the probe adapter 86 with the BOAS assembly 56 in a fully-assembled condition, for example, the probe cable 110 may be bent prior to installation of the probe 88 within the probe adapter 86.

While the probe adapter 86 is described herein with respect to the BOAS assembly 56, it should be understood that the probe adapter 86 may be used in connection with other structural components of the gas turbine engine 10 and for other data collection purposes. For example, the probe adapter 86 may be mounted to a case (e.g., a turbine case), a flow separator wall (e.g., a wall separating the core flow path 22 and the bypass flow path 20), or another structure of the gas turbine engine 10 for the purpose of collecting NSMS or other data. For further example, the probe adapter 86 may be mounted to a structure of the gas turbine engine 10 along the core flow path 22, for example, a combustor wall assembly of the combustor 50, for the purpose of collecting core flow path fluid, combustion, and/or exhaust data.

While various aspects of the present disclosure have been disclosed, it will be apparent to those of ordinary skill in the art that many more embodiments and implementations are possible within the scope of the present disclosure. For example, the present disclosure as described herein includes several aspects and embodiments that include particular features. Although these particular features may be described individually, it is within the scope of the present disclosure that some or all of these features may be combined with any one of the aspects and remain within the scope of the present disclosure. References to "various embodiments," "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Accordingly, the present disclosure is not to be restricted except in light of the attached claims and their equivalents.

What is claimed is:

1. A probe adapter, comprising:
    an adapter body comprising a probe aperture and a slot, the adapter body comprising an inner adapter side and an outer adapter side extending between a first adapter end and a second adapter end, the probe aperture extending from the inner adapter side to the outer adapter side, the slot oriented in a slot direction extending between the first adapter end and the second adapter end, at least a portion of the slot disposed within the probe aperture;
    a driver slidably mounted within the slot and slidable between a first position and a second position, the driver comprising a first end and a second end opposite the first end, the first end comprising a ramped recess extending in a direction from the first end toward the second end;
    a threaded fastener configured to contact the second end of the driver so as to retain the driver in the first position; and
    an adapter portion mounted to the second adapter end of the adapter body, the adapter portion comprising a threaded aperture configured to threadably retain the threaded fastener.

2. The probe adapter of claim 1, wherein the adapter body is configured to be mounted to an outer radial side of a blade outer air seal (BOAS).

3. The probe adapter of claim 1, wherein, in the first position, the driver is configured to retain a probe assembly of a probe within the probe aperture and, in the second position, the driver is configured to permit removal of the probe assembly from the probe aperture.

4. The probe adapter of claim 1, further comprising a plug retained within the probe aperture of the adapter body by the driver in the first position.

5. A gas turbine engine comprising:
    a blade outer air seal (BOAS) comprising an inner radial side and an outer radial side;
    a probe adapter mounted to the outer radial side of the BOAS, the probe adapter comprising:
    an adapter body comprising a probe aperture and a slot;
    a driver slidably mounted within the slot and slidable between a first position and a second position, the driver comprising a first end and a second end opposite the first end, the first end comprising a ramped recess extending in a direction from the first end toward the second end;
    a threaded fastener configured to contact the second end of the driver so as to retain the driver in the first position; and
    a plug retained within the probe aperture of the adapter body by the driver in the first position.

6. The gas turbine engine of claim 5, wherein the BOAS and the probe adapter form an integral component.

7. The gas turbine engine of claim 5, wherein the probe adapter further comprises an adapter portion mounted to the adapter body, the adapter portion comprising a threaded aperture configured to threadably retain the threaded fastener.

8. The gas turbine engine of claim 5, wherein the adapter body comprises an inner adapter side and an outer adapter side extending between a first adapter end and a second adapter end and wherein the probe aperture extends from the inner adapter side to the outer adapter side.

9. The gas turbine engine of claim 8, wherein the slot is oriented in a slot direction extending between the first adapter end and the second adapter end.

10. The gas turbine engine of claim 5, further comprising a heat shield in contact with the BOAS and disposed radially outside of the probe adapter.

11. A method for installing a probe in a probe adapter for a blade outer air seal (BOAS), the method comprising:
    providing the probe adapter mounted to an outer radial side of the BOAS, the probe adapter comprising an adapter body comprising a probe aperture and a slot;

positioning a driver slidably mounted within the slot in a second position, the driver comprising a first end and a second end opposite the first end, the first end comprising a ramped recess extending in a direction from the first end toward the second end;

installing the probe in the probe adapter by positioning a probe assembly of the probe within the probe aperture; and inserting a threaded fastener into the probe adapter and contacting the second end of the driver with the threaded fastener so as to slide the driver from the second position to a first position to retain the probe assembly within the probe aperture.

12. The method of claim 11, contacting a probe cable of the probe with the first end of the driver.

13. The method of claim 12, further comprising bending the probe cable subsequent to sliding the driver from the second position to the first position.

* * * * *